(12) United States Patent
Senda

(10) Patent No.: US 9,991,349 B2
(45) Date of Patent: Jun. 5, 2018

(54) SEMICONDUCTOR DEVICE AND METHOD FOR MANUFACTURING SEMICONDUCTOR DEVICE

(71) Applicant: Kabushiki Kaisha Toshiba, Minato-ku (JP)

(72) Inventor: Ryota Senda, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 249 days.

(21) Appl. No.: 14/820,818

(22) Filed: Aug. 7, 2015

(65) Prior Publication Data

US 2016/0056273 A1 Feb. 25, 2016

(30) Foreign Application Priority Data

Aug. 20, 2014 (JP) .................. 2014-167515

(51) Int. Cl.
| | |
|---|---|
| *H01L 29/778* | (2006.01) |
| *H01L 29/417* | (2006.01) |
| *H01L 29/45* | (2006.01) |
| *H01L 23/48* | (2006.01) |
| *H01L 29/20* | (2006.01) |

(52) U.S. Cl.
CPC ........ *H01L 29/4175* (2013.01); *H01L 23/481* (2013.01); *H01L 29/452* (2013.01); *H01L 29/7786* (2013.01); *H01L 29/2003* (2013.01); *H01L 29/41758* (2013.01)

(58) Field of Classification Search
None
See application file for complete search history.

(56) References Cited

U.S. PATENT DOCUMENTS

| | | | |
|---|---|---|---|
| 8,455,951 B2 | 6/2013 | Kosaka | |
| 9,391,136 B1 * | 7/2016 | Kawaguchi | ......... H01L 29/0619 |
| 2010/0295100 A1 | 11/2010 | Huang et al. | |
| 2011/0084341 A1 * | 4/2011 | Kosaka | ................ H01L 23/142 |
| | | | 257/368 |

(Continued)

FOREIGN PATENT DOCUMENTS

| | | | |
|---|---|---|---|
| JP | 2003303842 A | * 10/2003 | ............. H01L 24/11 |
| JP | 2009-289935 A | 12/2009 | |

(Continued)

OTHER PUBLICATIONS

English Abstract of Takahashi. No Date!*

*Primary Examiner* — Hrayr A Sayadian
(74) *Attorney, Agent, or Firm* — Oblon, McClelland, Maier & Neustadt, L.L.P.

(57) ABSTRACT

Certain embodiments provide a semiconductor device including a semiconductor substrate, a semiconductor element, and wiring. The semiconductor element has an electrode provided on a surface of the semiconductor substrate. The electrode includes a junction layer joined to the surface of the semiconductor substrate, a diffusion-suppressing layer provided on the junction layer, and a pad layer provided on the diffusion-suppressing layer. The wiring is provided on a back surface of the semiconductor substrate and on an inner surface of a through hole which penetrates the semiconductor substrate immediately below the electrode. The wiring is electrically connected to the electrode.

6 Claims, 7 Drawing Sheets

(56) References Cited

U.S. PATENT DOCUMENTS

2013/0288401 A1 10/2013 Matsuura
2014/0159049 A1* 6/2014 Ko .................... H01L 29/4175
257/76

FOREIGN PATENT DOCUMENTS

JP 2013-232513 11/2013
JP 2014-82427 A 5/2014

* cited by examiner

SEMICONDUCTOR DEVICE AND METHOD FOR MANUFACTURING SEMICONDUCTOR DEVICE

CROSS REFERENCE TO RELATED APPLICATIONS

This application is based upon and claims the benefit of priority from the prior Japanese Patent Application No. 2014-167515 filed in Japan on Aug. 20, 2014; the entire contents of which are incorporated herein by reference.

FIELD

Embodiments described herein relate generally to a semiconductor device and a method for manufacturing the semiconductor device.

BACKGROUND

In conventional semiconductor devices such as field effect transistors (FETs) and high electron mobility transistors (HEMTs), a through hole is provided in a semiconductor substrate immediately below a source electrode. A grounding conductor is provided on the back surface of the semiconductor substrate, including the inner surface of the through hole so that the grounding conductor is in contact with the source electrode.

Such conventional semiconductor devices are mounted on a mounting substrate by interposing Au—Sn solder between the grounding conductor and grounding wiring of the mounting substrate.

DESCRIPTION OF THE EMBODIMENTS

Certain embodiments provide a semiconductor device including a semiconductor substrate, a semiconductor element, and wiring. The semiconductor element has an electrode provided on a surface of the semiconductor substrate. The electrode includes a junction layer joined to the surface of the semiconductor substrate, a diffusion-suppressing layer provided on the junction layer, and a pad layer provided on the diffusion-suppressing layer. The wiring is provided on a back surface of the semiconductor substrate and on an inner surface of a through hole which penetrates the semiconductor substrate immediately below the electrode. The wiring is electrically connected to the electrode.

Certain embodiments provide a method for manufacturing a semiconductor device, including: forming an electrode of a semiconductor element by laminating a junction layer, a diffusion-suppressing layer, and a pad layer on a surface of a semiconductor substrate in the order mentioned; forming a through hole in the semiconductor substrate immediately below the electrode so as to penetrate at least the semiconductor substrate; and forming wiring on a back surface of the semiconductor substrate and on an inner surface of the through hole formed in the semiconductor substrate so as to be electrically connected to the electrode.

Figure 1:
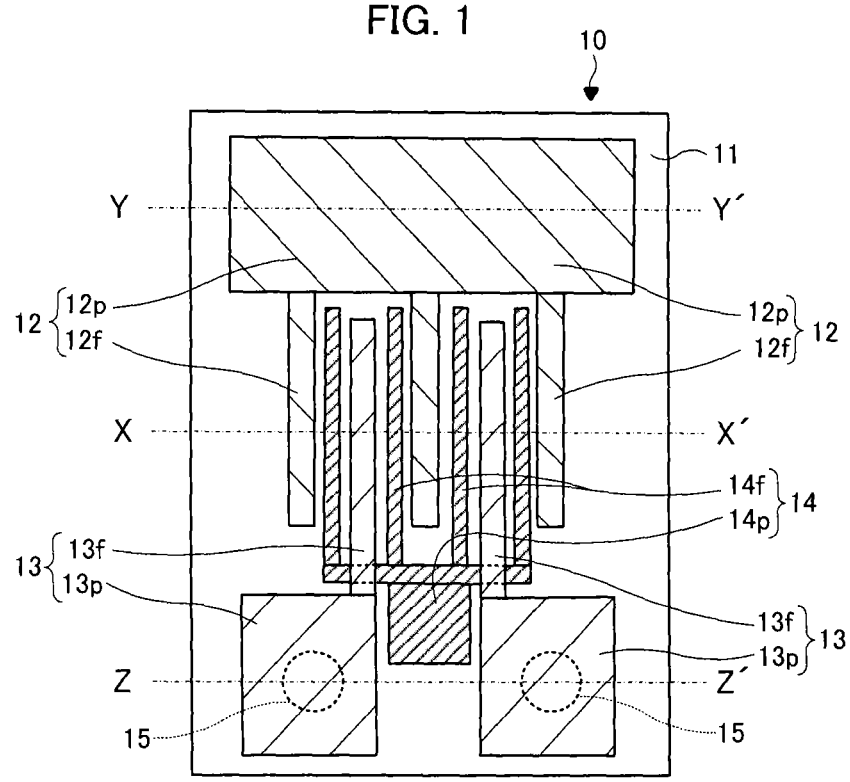
FIG. 1 is a top view schematically showing a semiconductor device according to an embodiment.

A semiconductor device according to one of embodiments and a method for manufacturing the semiconductor device will be described below with reference to the drawings. FIG. 1 is a top view schematically showing a semiconductor device 10 according to the present embodiment. In FIG. 1, a protective film, to be described later, is not shown.

In the semiconductor device 10 shown in FIG. 1, a semiconductor element having electrodes is provided on a plate-form semiconductor substrate 11. The semiconductor element, for example, is a high electron mobility transistor (HEMT) having a drain electrode 12, a source electrode 13, and a gate electrode 14.

Each of the drain electrode 12, the source electrode 13, and the gate electrode 14 is provided on a surface of the semiconductor substrate 11. The drain electrode 12 includes a plurality of drain finger portions 12f and a drain pad portion 12p. Each end of the plurality of drain finger portions 12f is connected to the drain pad portion 12p. Similarly, the source electrode 13 includes a plurality of source finger portions 13f and a plurality of source pad portions 13p, to which one end of each source finger portion 13f is connected. The gate electrode 14 includes a plurality of gate finger portions 14f and a gate pad portion 14p, to which one end of each gate finger portion 14f is connected.

The drain finger portions 12f are mutually disposed so as to be spaced at a predetermined interval. Each of the source finger portions 13f is disposed between the drain finger portions 12f. Each of the gate finger portions 14f is disposed between the drain finger portion 12f and the source finger portion 13f. The finger portions 12f, 13f, and 14f are arranged in parallel to each other.

The drain pad portion 12p and the plurality of source pad portions 13p are mutually disposed so as to be spaced at an interval. The finger portions 12f, 13f, and 14f are disposed between the drain pad portion 12p and the plurality of source pad portions 13p. The gate pad portion 14p is disposed between the source pad portions 13p.

Figure 2A:
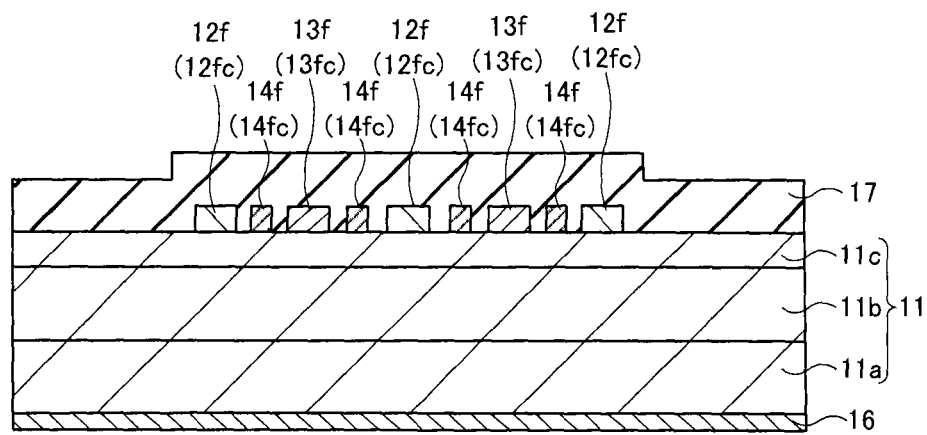
FIG. 2A is a cross-sectional view of the semiconductor device shown along an alternate long and short dashed line X-X' in FIG. 1.
Figure 2B:
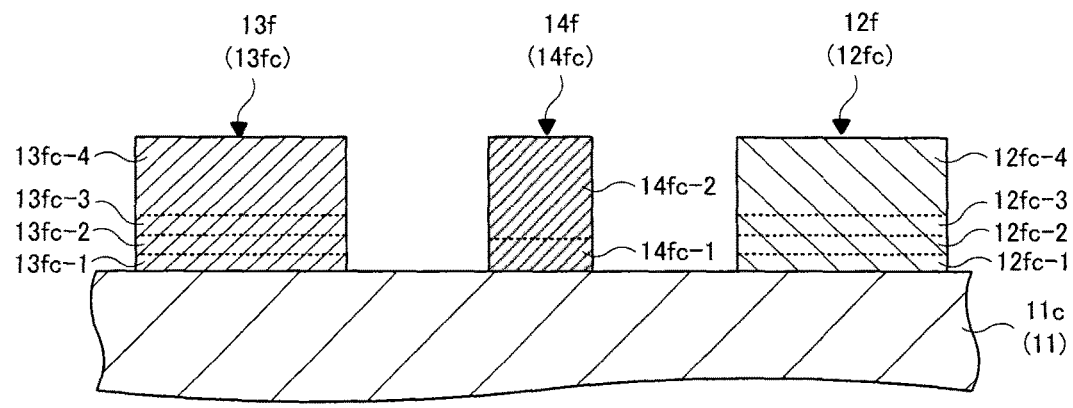
FIG. 2B is an enlarged cross-sectional view of one portion of the semiconductor device shown in FIG. 2A.
Figure 3A:
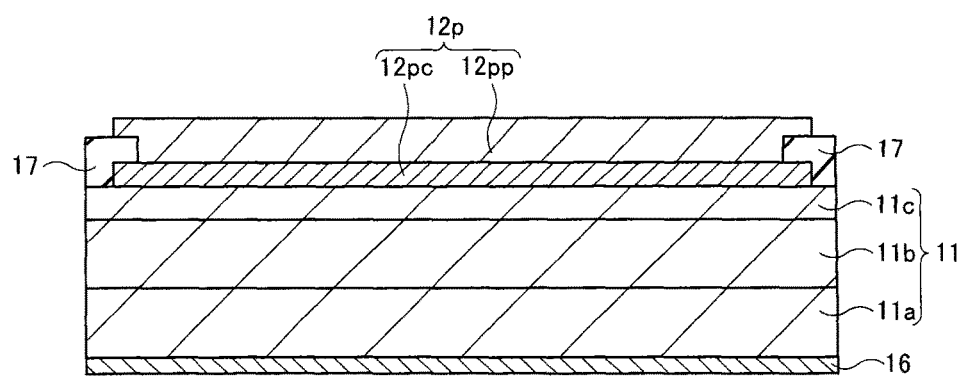
FIG. 3A is a cross-sectional view of the semiconductor device shown along an alternate long and short dashed line Y-Y' in FIG. 1.
Figure 3B:
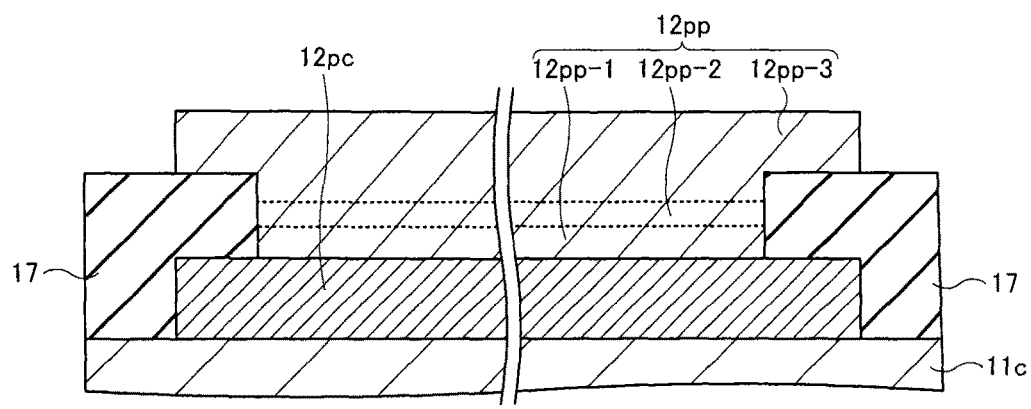
FIG. 3B is an enlarged cross-sectional view of one portion of the semiconductor device shown in FIG. 3A.
Figure 4A:
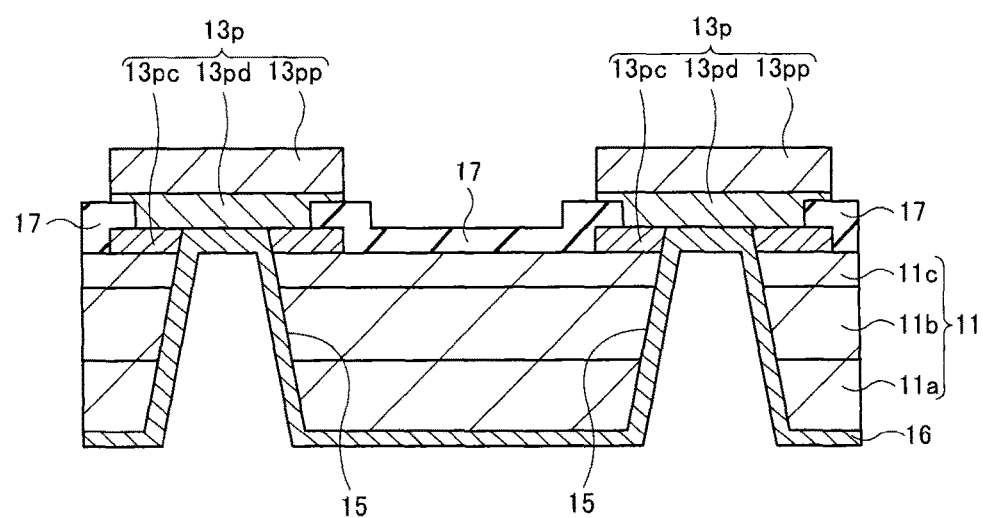
FIG. 4A is a cross-sectional view of the semiconductor device shown along an alternate long and short dashed line Z-Z' in FIG. 1.
Figure 4B:
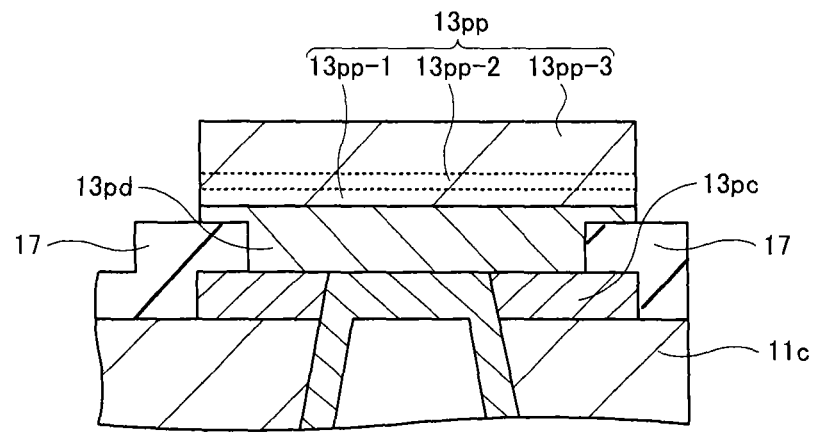
FIG. 4B is an enlarged cross-sectional view of one portion of the semiconductor device shown in FIG. 4A.

FIG. 2A is a cross-sectional view of the semiconductor device 10 along an alternate long and short dashed line X-X' in FIG. 1. FIG. 2B is an enlarged cross-sectional view of one portion of the semiconductor device 10 shown in FIG. 2A. FIG. 3A is a cross-sectional view of the semiconductor device 10 along an alternate long and short dashed line Y-Y' in FIG. 1. FIG. 3B is an enlarged cross-sectional view of one portion of the semiconductor device 10 shown in FIG. 3A. FIG. 4A is a cross-sectional view of the semiconductor device 10 along an alternate long and short dashed line Z-Z' in FIG. 1. FIG. 4B is an enlarged cross-sectional view of one portion of the semiconductor device 10 shown in FIG. 4A. The semiconductor device 10 according to this embodiment will be described below in more detail with reference to FIGS. 2A to 4B.

As shown in each of FIGS. 2A to 4B, the semiconductor substrate 11 is a structure including, for example, an SiC substrate 11a, a GaN layer 11b, and an AlGaN layer 11c, laminated in the order mentioned. In this embodiment, the thickness of the semiconductor substrate 11 is approximately 50 μm. In this embodiment, the GaN layer 11b is an electron transit layer and the AlGaN layer 11c is an electron supply layer.

As shown in FIG. 2A, the finger portions 12f, 13f, and 14f of the electrodes 12, 13, and 14 include junction layers 12fc, 13fc, and 14fc, respectively. The junction layers 12fc, 13fc, and 14fc are joined to the surface of the semiconductor substrate 11 (the surface of the AlGaN layer 11c). As shown in FIG. 2B, the junction layer 14fc serving as the gate finger portion 14f is in Schottky junction with the surface of the semiconductor substrate 11 (the surface of the AlGaN layer 11c). This junction layer 14fc includes, for example, an Ni layer 14fc-1 and an Au layer 14fc-2, laminated in the order mentioned. Each of the junction layer 12fc serving as the drain finger portion 12f and the junction layer 13fc serving as the source finger portion 13f is in ohmic contact with the surface of the semiconductor substrate 11 (the surface of the AlGaN layer 11c). The junction layer 12fc is a structure, with a thickness of approximately 300 to 400 nm, including, for example, a Ti layer 12fc-1, an Al layer 12fc-2, an Ni layer 12fc-3, and an Au layer 12fc-4, laminated in the order mentioned. Similarly, the junction layer 13fc is a structure, with a thickness of approximately 300 to 400 nm, including, for example, a Ti layer 13fc-1, an Al layer 13fc-2, an Ni layer 13fc-3, and an Au layer 13fc-4, laminated in the order mentioned.

As shown in FIG. 3A, the drain pad portion 12p includes a junction layer 12pc joined to the surface of the semiconductor substrate 11 (the surface of the AlGaN layer 11c) and a pad layer 12pp provided on the surface of the junction layer 12pc. The junction layer 12pc is provided integrally with the junction layer 12fc serving as the drain finger portion 12f and has the same structure as the junction layer 12fc. The pad layer 12pp is formed to be at least thicker than the junction layer 12pc. As shown in FIG. 3B, the pad layer 12pp is a structure including, for example, a Ti layer 12pp-1, a Pt layer 12pp-2, and an Au layer 12pp-3, laminated in the order mentioned.

As shown in FIG. 4A, like the drain pad portion 12p, each of the plurality of source pad portions 13p includes a junction layer 13pc and a pad layer 13pp provided thereon. The junction layer 13pc is joined to the surface of the semiconductor substrate 11 (the surface of the AlGaN layer 11c) and has the same structure as the junction layer 13fc of the source finger portion 13f. Furthermore, each of the plurality of source pad portions 13p further includes a diffusion-suppressing layer 13pd between the junction layer 13pc and the pad layer 13pp. In other words, the source pad portion 13p includes the junction layer 13pc, the diffusion-suppressing layer 13pd, and the pad layer 13pp, laminated in the order mentioned. The diffusion-suppressing layer 13pd is provided in order to suppress diffusion of materials included in the pad layer 13pp (e.g. Ti, Pt, and Au) into Au—Sn solder 18 (FIG. 5A) used for mounting the semiconductor device 10. The junction layer 13pc is a laminated structure provided integrally with the junction layer 13fc. The diffusion-suppressing layer 13pd is, for example, an Ni layer with a thickness of approximately 500 nm. As shown in FIG. 4B, the pad layer 13pp is formed to be at least thicker than the junction layer 13pc, and is a structure including, for example, a Ti layer 13pp-1, a Pt layer 13pp-2, and an Au layer 13pp-3, laminated in the order mentioned.

As shown in FIG. 4A, in the semiconductor substrate 11 provided with the electrodes 12, 13, and 14 as described above, a through hole 15 penetrating the semiconductor substrate 11 in a tapered manner is formed in the semiconductor substrate 11 immediately below each of the source pad portions 13p. On the entire back surface of the semiconductor substrate 11 including the inner surface of the through hole 15, grounding wiring 16, which is wiring on the back side, is formed of, for example, Au in such a manner as to be in contact with the source pad portion 13p exposed from the through hole 15 (FIGS. 2A, 3A, and 4A).

Figure 4C:
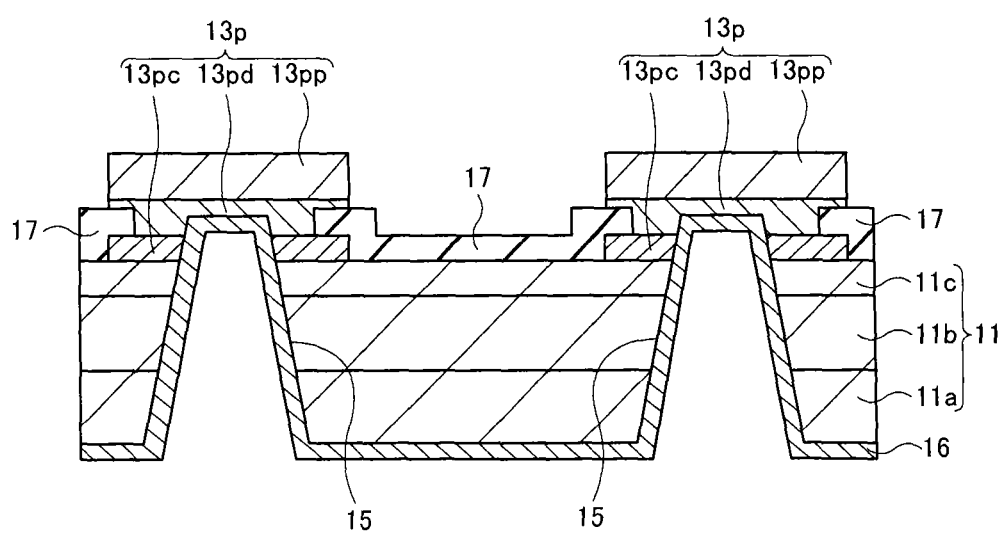
FIG. 4C is a cross-sectional view, corresponding to FIG. 4A, showing a modification to a through hole.

Although it is preferable that the through hole 15 penetrate only the semiconductor substrate 11, the through hole 15 may be further extended to a lower portion of the source pad portion 13p to ensure that the semiconductor substrate 11 is penetrated without fail in the process of forming the through hole 15. In other words, the through hole 15 formed in the semiconductor substrate 11 may be formed in such a manner as to penetrate the junction layer 13pc so as to make the diffusion-suppressing layer 13pd exposed therefrom as shown in FIG. 4A. Alternatively, as shown in FIG. 4C, the through hole 15 may be extended to the diffusion-suppressing layer 13pd as long as the through hole 15 does not penetrate the diffusion-suppressing layer 13pd and the diffusion-suppressing layer 13pd is exposed from the through hole 15. In either case, the grounding wiring 16 is provided so as to be in contact with the diffusion-suppressing layer 13pd of the source pad portion 13p exposed from the through hole 15.

Although not shown, the gate pad portion 14p includes a junction layer, provided integrally with the junction layer 14fc serving as the gate finger portion 14f and having the same structure as the junction layer 14fc, and a pad layer provided on a surface of the junction layer. The pad layer includes, for example, Ti, Pt, and Au, laminated in the order mentioned.

As shown in FIGS. 2A, 3A, and 4A, a protective film 17 is provided on the surface of the semiconductor substrate 11 with the electrodes 12, 13, and 14 as described above, so that the protective film 17 covers the electrodes 12, 13, and 14 including the finger portions 12f, 13f, and 14f and exposes parts of the pad portions 12p, 13p, and 14p of the electrodes 12, 13, and 14. The protective film 17 includes, for example, SiN.

Figure 5A:
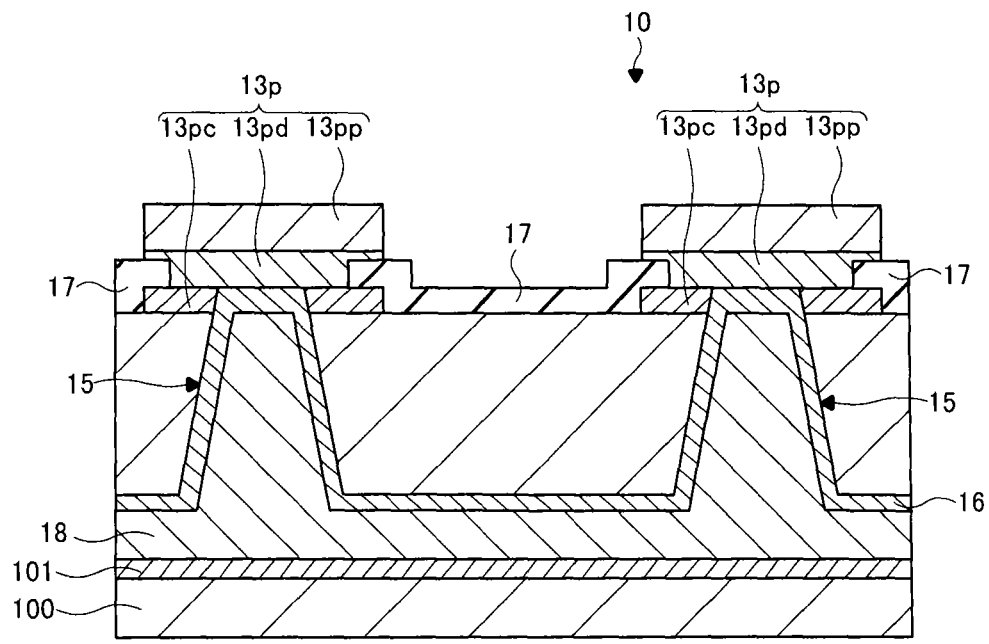
FIG. 5A is a cross-sectional view, corresponding to FIG. 4A, showing the semiconductor device according to the embodiment mounted on a mounting substrate.

FIG. 5A is a cross-sectional view, corresponding to FIG. 4A, showing the main part of the semiconductor device 10 according to the embodiment, mounted on a mounting substrate. As shown in FIG. 5A, the semiconductor device 10 is mounted on a mounting substrate 100 by the Au—Sn solder 18 interposed between grounding wiring 101 on the mounting substrate 100 and the surface of the grounding wiring 16. The Au—Sn solder 18 used for mounting is provided to fill the inner part of the through hole 15. Although not shown, the gate pad portion 14*p* of the mounted semiconductor device 10 is connected to input-side wiring of the mounting substrate 100 by a connection conductor such as a wire. The drain pad portion 12*p* of the mounted semiconductor device 10 is connected to output-side wiring of the mounting substrate 100 by a connection conductor such as a wire.

Figure 5B:
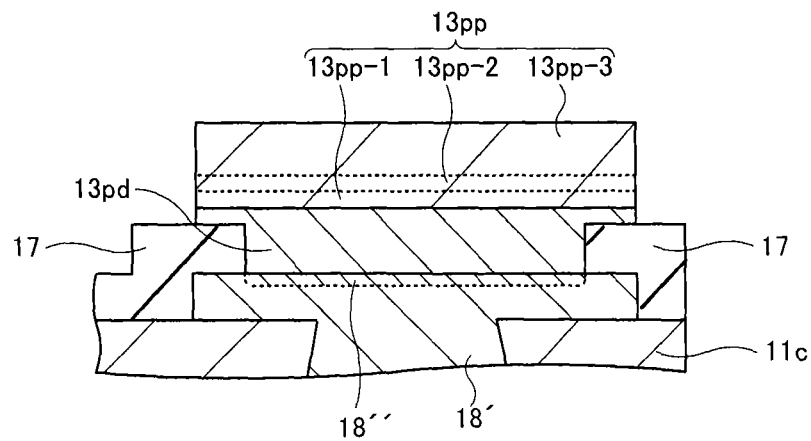
FIG. 5B is an enlarged cross-sectional view of one portion of the semiconductor device shown in FIG. 5A.

When the semiconductor device 10 is mounted in such a manner, at least the Au—Sn solder 18 close to the semiconductor device 10 is mixed with the grounding wiring 16 and further with the junction layer 13*pc* of the source electrode 13. In this manner, the Au—Sn solder 18, the grounding wiring 16, and the junction layer 13*pc* form alloyed Au—Sn solder 18' as shown in FIG. 5B. Thereafter, Ni in the diffusion-suppressing layer 13*pd* and Sn in the alloyed Au—Sn solder 18' form an intermetallic compound 18" within the alloyed Au—Sn solder 18' near an interface between the alloyed Au—Sn solder 18' and the diffusion-suppressing layer 13*pd*. The intermetallic compound 18" thus formed suppresses diffusion of Au included in the pad layer 13*pp* into the alloyed Au—Sn solder 18'.

Next, a method for manufacturing the semiconductor device according to this embodiment having been described will be described with reference to FIGS. 6 to 9. Each of FIGS. 6 to 9 is a cross-sectional view, corresponding to FIG. 4A, for describing the method for manufacturing the semiconductor device 10 according to the embodiment.

Figure 6:
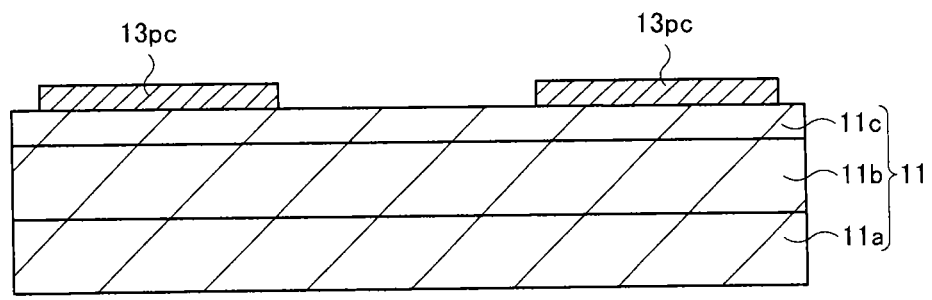
FIG. 6 is a cross-sectional view, corresponding to FIG. 4A, for describing a method for manufacturing the semiconductor device according to the embodiment.

First, as shown in FIG. 6, for example, the GaN layer 11*b* is formed by epitaxial growth on the surface of the SiC substrate 11*a*, and the AlGaN layer 11*c* is formed by epitaxial growth on the surface of the GaN layer 11*b*. Thus, the semiconductor substrate 11 is formed. Next, in a predetermined area on the surface of the semiconductor substrate 11 (the surface of the AlGaN layer 11*c*), the junction layer 13*pc* of the source electrode 13 is formed. The junction layer 13*pc* is in ohmic contact with the surface of the semiconductor substrate 11 (the surface of the AlGaN layer 11*c*). The junction layer 13*pc* in ohmic contact is formed by forming a metal film serving as the junction layer 13*pc* by, for example, a vapor deposition method and a lift-off method, and then performing an annealing method. Note that, concurrently with formation of the junction layer 13*pc* of the source electrode 13, the junction layer 13*fc* of the source electrode 13 and the junction layers 12*fc* and 12*pc* of the drain electrode 12 are also formed. Before or after formation of the junction layers 12*fc*, 12*pc*, 13*fc*, and 13*pc* of the electrodes 12 and 13, the junction layers of the gate electrode 14 are also formed by the vapor deposition method, the lift-off method, and annealing.

Figure 7:
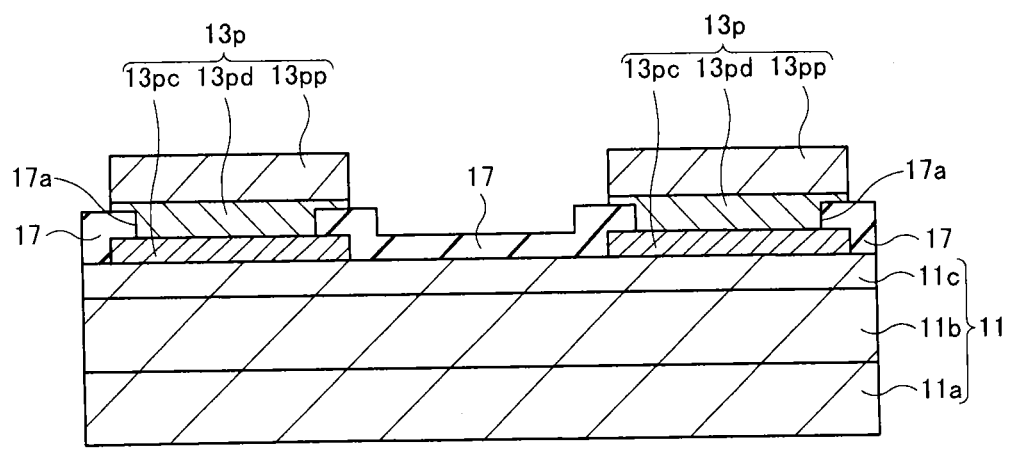
FIG. 7 is a cross-sectional view, corresponding to FIG. 4A, for describing the method for manufacturing the semiconductor device according to the embodiment.

Next, on the surface of the semiconductor substrate 11 (the surface of the AlGaN layer 11*c*) provided with the junction layers 12*fc*, 12*pc*, 13*fc*, 13*pc*, and 14*fc* of the electrodes 12, 13, and 14, the protective film 17 is formed to cover the junction layers 12*fc*, 12*pc*, 13*fc*, 13*pc*, and 14*fc* of the electrodes 12, 13, and 14 by, for example, a CVD method. Then, as shown in FIG. 7, openings 17*a* are formed in the protective film 17 such that portions of the junction layer 13*pc* of the source pad portion 13*p* are exposed therefrom. Concurrently with formation of the openings 17*a*, an opening to expose a portion of the junction layer 12*pc* of the drain pad portion 12*p* is also formed.

Thereafter, as shown in FIG. 7, the diffusion-suppressing layer 13*pd* of a desired thickness is formed on a surface of each of the junction layers 13*pc* of the source pad portions 13*p*. This "desired thickness" will be described later.

The diffusion-suppressing layer 13*pd* formed in this process, together with the solder 18 used for mounting the semiconductor device 10, forms the intermetallic compound 18" as described with reference to FIGS. 5A and 5B. This intermetallic compound 18" suppresses diffusion of Au included in the pad layer 13*pp* into the solder 18. When the Ni layer is formed as the diffusion-suppressing layer 13*pd*, the Ni layer further functions as a barrier layer upon etching a GaN-based semiconductor substrate. Therefore, it is possible to suppress occurrence of a problem that the through hole 15 penetrates the diffusion-suppressing layer 13*pd* and reaches the pad layer 13*pp* in the formation process of the through hole 15 to be described later with reference to FIG. 8.

The diffusion-suppressing layer 13*pd* is formed on the surface of the junction layer 13*pc* of the source pad portion 13*p*, and then the pad layer 13*pp* is formed on a surface of the diffusion-suppressing layer 13*pd* as shown in FIG. 7. Concurrently with formation of the pad layer 13*pp*, the pad layer 12*pp* is also formed on the surface of the junction layer 12*pc* of the drain pad portion 12*p*. Note that, when the pad layer of the gate pad portion 14*p* is formed of the same material as the pad layers 12*pp* and 13*pp*, the pad layer of the gate pad portion 14*p* may be formed concurrently with the pad layers 12*pp* and 13*pp*. When the pad layer of the gate pad portion 14*p* is formed of a different material from the pad layers 12*pp* and 13*pp*, on the other hand, the pad layer of the gate pad portion 14*p* may be formed in a process different from the formation process of the pad layers 12*pp* and 13*pp* before or after formation of the pad layers 12*pp* and 13*pp*.

Figure 8:
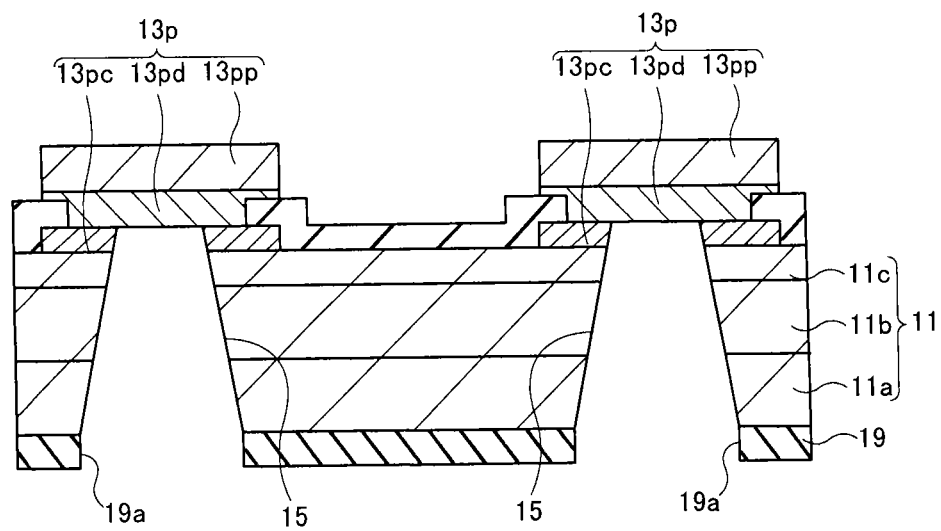
FIG. 8 is a cross-sectional view, corresponding to FIG. 4A, for describing the method for manufacturing the semiconductor device according to the embodiment.

Next, as shown in FIG. 8, a resist layer 19 is formed on the back surface of the semiconductor substrate 11. An opening 19*a* is then formed at a partial area of the resist layer 19 immediately below the source pad portion 13*p*. Thereafter, the through hole 15 is formed so as to penetrate at least the semiconductor substrate 11 by etching the semiconductor substrate 11 using the resist layer 19 to which the opening 19*a* is formed as a mask. The etching is, for example, dry etching of an RIE method using a fluorine-based etching gas. An etching amount upon formation of the through hole 15 is defined as follows.

Basically, when the thickness of the semiconductor substrate 11 is D μm, the etching amount can be defined such that the semiconductor substrate is etched by D μm.

However, when there is a manufacturing error of ±d μm in the etching process, there are cases where the semiconductor substrate 11 is actually etched by only D−d μm. In such cases, since the through hole 15 is not formed, the grounding wiring 16 to be formed in a subsequent process cannot come into contact with the source pad portion 13*p*.

Therefore, in order to form the through hole 15 in the semiconductor substrate 11 even with the manufacturing error, the etching amount is defined such that the semiconductor substrate 11 is etched by D+d' μm, the sum of an etching amount where the semiconductor substrate 11 is etched by D μm and an overetching amount of d' μm (>d μm). In other words, the etching amount in the process of forming the through hole 15 can be defined as a second etching amount (D+d' μm) obtained as the sum of a first etching amount equivalent to the thickness of the semiconductor substrate 11 (D μm) and a desired overetching amount (d' μm). Defining the etching amount as described above substantially ensures that the semiconductor substrate 11 is penetrated without fail. Note that the etching amount may be controlled by, for example, etching time.

Based on such control of the etching amount, the diffusion-suppressing layer 13pd is formed so as to have the following thickness.

Since the second etching amount in the above-described process includes the overetching amount, the through hole 15 may be extended to an inner portion of the source pad portion 13p. Therefore, at least the diffusion-suppressing layer 13pd included in the source pad portion 13p is formed so as to have a thickness larger than the overetching amount (d' μm). The diffusion-suppressing layer 13pd having such a thickness can suppress the occurrence of the problem that the through hole 15 penetrates the diffusion-suppressing layer 13pd and reaches the pad layer 13pp. As a result, as shown in FIG. 5A, it is possible to interpose the Ni layer, serving as the diffusion-suppressing layer 13pd, between the Au—Sn solder 18 in the through hole 15 and the pad layer 13pp in the semiconductor device 10 mounted on the mounting substrate 100. In other words, the "desired thickness" of the diffusion-suppressing layer 13pd formed in the process shown in FIG. 7 is a thickness larger than at least the overetching amount (d' μm).

However, an excessive thickness of the diffusion-suppressing layer 13pd results in failures such as increased resistance in the source pad portion 13p. To suppress occurrence of such failures, for example, it is preferable to form the diffusion-suppressing layer 13pd so as to have a thickness smaller than the second etching amount (D+d' μm). In other words, the "desired thickness" of the diffusion-suppressing layer 13pd formed in the process shown in FIG. 7 is a thickness smaller than the second etching amount (D+d' μm).

Figure 9:
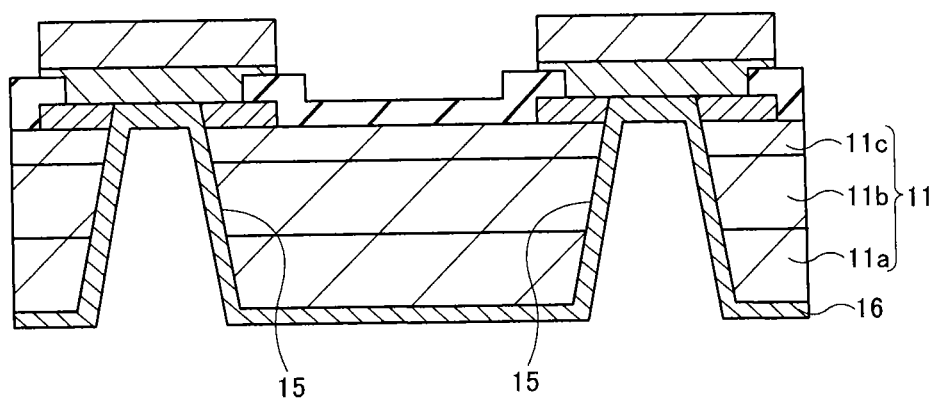
FIG. 9 is a cross-sectional view, corresponding to FIG. 4A, for describing the method for manufacturing the semiconductor device according to the embodiment.

After the diffusion-suppressing layer 13pd having the "desired thickness" as described above is formed, the through hole 15 is formed by etching the semiconductor substrate 11 so that the through hole 15 penetrates the semiconductor substrate 11 and the diffusion-suppressing layer 13pd remains in the source pad portion 13p. After this process, the resist layer 19 is removed by, for example, ashing. Thereafter, as shown in FIG. 9, the grounding wiring is formed on the entire back surface of the semiconductor substrate 11 including the inner surface of the through hole 15 by a plating method or a vapor deposition method.

In this manner, the semiconductor device 10 according to the embodiment can be manufactured. The manufactured semiconductor device 10 can be mounted on the mounting substrate 100 via the solder 18 as shown in FIG. 5A.

According to the semiconductor device according to this embodiment and the method for manufacturing the semiconductor device according to this embodiment, the source pad portion 13p, disposed immediately above the through hole 15 penetrating the semiconductor substrate 11, includes the diffusion-suppressing layer 13pd including, for example, the Ni layer. The diffusion-suppressing layer 13pd, with the Au—Sn solder 18 used for mounting the semiconductor device 10, forms the intermetallic compound 18''. This compound 18'' suppresses diffusion of Au included in the pad layer 13pp into the Au—Sn solder 18. It is possible to suppress corrosion, deformation, and/or disconnection of the pad layer 13pp due to diffusion of Au. As a result, it is possible to provide the semiconductor device 10 with high reliability and the method for manufacturing the semiconductor device 10.

Furthermore, when the semiconductor substrate includes a GaN-based material, and when the diffusion-suppressing layer 13pd includes the Ni layer, the diffusion-suppressing layer 13pd can function as a barrier layer upon etching the semiconductor substrate 11. Therefore, it is possible to further suppress the occurrence of the problem that the through hole 15 penetrates the diffusion-suppressing layer 13pd in the formation process of the through hole 15. The diffusion-suppressing layer 13pd can remain in the source pad portion 13p after formation of the through hole 15. As a result, it is possible to increase a distance between the pad layer 13pp and the Au—Sn solder 18. Therefore, diffusion of Au included in the pad layer 13pp into the Au—Sn solder 18 can be further suppressed. As a result, the semiconductor device 10 with higher reliability and the method for manufacturing the semiconductor device 10 are provided.

Also, according to the method for manufacturing the semiconductor device according to the embodiment, the diffusion-suppressing layer 13pd is formed so that the diffusion-suppressing layer 13pd has a thickness larger than at least the overetching amount for forming the through hole 15. Therefore, it is possible to further suppress the occurrence of the problem that the through hole 15 penetrates the diffusion-suppressing layer 13pd in the formation process of the through hole 15. As a result, it is possible to suppress entire removal of the diffusion-suppressing layer 13pd from the source pad portion 13p by etching for forming the through hole 15. Therefore, it is possible to provide the method for manufacturing the semiconductor device 10 with higher reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a semiconductor substrate having a through hole which penetrates the semiconductor substrate;
   a semiconductor element having an electrode, the electrode being provided on a surface of the semiconductor substrate;
   wiring electrically connected to the electrode, the wiring being provided on a back surface of the semiconductor substrate and on an inner surface of the through hole immediately below the electrode;
   solder provided in the through hole and including an intermetallic compound; and
   wherein the electrode comprises:
   a junction layer joined to the surface of the semiconductor substrate;
   a diffusion-suppressing layer provided on the junction layer; and
   a pad layer provided on the diffusion-suppressing layer,
   wherein the junction layer has an opening leading to the through hole,
   the diffusion-suppressing layer exposes from the opening, and
   the intermetallic compound is a reactant between solder component of the solder and the diffusion-suppressing layer.

2. The semiconductor device of claim 1,
wherein
the wiring is provided so as to be in contact with the diffusion-suppressing layer exposed from the through hole.

3. The semiconductor device of claim 1, comprising:
a mounted on a mounting substrate on which the semiconductor devise is mounted via the solder.

4. The semiconductor device of claim 3,
wherein the solder is provided so as to fill the through hole.

5. The semiconductor device of claim 4,
wherein the solder is a metal including Au and Sn,
the diffusion-suppressing layer includes an Ni layer, and
the pad layer includes an Au layer.

6. The semiconductor device of claim 5,
wherein the semiconductor element is a high electron mobility transistor,
the electrode is a source electrode including a source finger portion and a source pad portion,
the junction layer included in the source electrode is provided in the source finger portion and in the source pad portion,
the diffusion-suppressing layer and the pad layer included in the source electrode are provided on the junction layer of the source pad portion, and
the through hole is provided in the semiconductor substrate immediately below the source pad portion.

* * * * *